(12) United States Patent
Zhu

(10) Patent No.: US 12,362,242 B2
(45) Date of Patent: Jul. 15, 2025

(54) TEST STRUCTURE OF WAFER AND METHOD OF MANUFACTURING TEST STRUCTURE OF WAFER

(71) Applicant: CHANGXIN MEMORY TECHNOLOGIES, INC., Hefei (CN)

(72) Inventor: Hongcheng Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 590 days.

(21) Appl. No.: 17/656,752

(22) Filed: Mar. 28, 2022

(65) Prior Publication Data
US 2023/0089462 A1  Mar. 23, 2023

(30) Foreign Application Priority Data
Sep. 17, 2021  (CN) .......................... 202111095434.0

(51) Int. Cl.
*H01L 21/66* (2006.01)
*H01L 21/033* (2006.01)
*H01L 21/762* (2006.01)
*H01L 21/768* (2006.01)

(52) U.S. Cl.
CPC .......... *H01L 22/32* (2013.01); *H01L 21/0337* (2013.01); *H01L 21/76224* (2013.01); *H01L 21/76877* (2013.01)

(58) Field of Classification Search
CPC ................. H01L 22/32; H01L 21/0337; H01L 21/76224; H01L 21/76877; H01L 22/34; H10B 12/485
See application file for complete search history.

(56) References Cited

U.S. PATENT DOCUMENTS

| | | | | |
|---|---|---|---|---|
| 6,881,597 B2 * | 4/2005 | Asayama | ................ | H01L 22/34 438/18 |
| 7,847,288 B2 | 12/2010 | Kwon | | |
| 10,746,787 B2 * | 8/2020 | Pagani | .................... | H01L 24/05 |
| 2010/0314619 A1 * | 12/2010 | Kaltalioglu | ............. | H01L 22/34 257/E21.585 |
| 2019/0035750 A1 * | 1/2019 | Han | ....................... | H01L 23/562 |
| 2019/0221535 A1 * | 7/2019 | Shin | ........................ | H01L 22/34 |
| 2020/0303268 A1 * | 9/2020 | Kim | ....................... | H01L 24/05 |
| 2024/0112963 A1 * | 4/2024 | Chen | ....................... | H01L 22/34 |

* cited by examiner

*Primary Examiner* — Bac H Au
(74) *Attorney, Agent, or Firm* — Syncoda LLC; Feng Ma

(57) ABSTRACT

Embodiments of the present disclosure provide a test structure of a wafer and a method of manufacturing a test structure of a wafer, and relate to the technical field of semiconductors. The test structure of a wafer includes at least one test unit provided in a scribe line of the wafer, where the test unit includes a first active area and a second active area that are connected to each other; the first active area is provided with a first conductive plug, and the second active area is provided with a second conductive plug; and one of the first active area and the second active area is provided with a contact structure.

15 Claims, 7 Drawing Sheets

TEST STRUCTURE OF WAFER AND METHOD OF MANUFACTURING TEST STRUCTURE OF WAFER

CROSS-REFERENCE TO RELATED APPLICATIONS

This application claims the priority of Chinese Patent Application No. 202111095434.0, submitted to the Chinese Intellectual Property Office on Sep. 17, 2021, the disclosure of which is incorporated herein in its entirety by reference.

TECHNICAL FIELD

Embodiments of the present disclosure relate to the technical field of semiconductors, and in particular to a test structure of a wafer and a method of manufacturing a test structure of a wafer.

BACKGROUND

The dynamic random access memory (DRAM) is a semiconductor memory that randomly writes and reads data at high speed, and is widely used in data storage devices. It is typically composed of multiple memory cells, each of which includes a transistor and a capacitor. The gate of the transistor is electrically connected to a word line (WL) of the DRAM, and on and off of the transistor is controlled by the voltage on the WL. One terminal of the transistor is electrically connected to a bit line (BL) through a bit line contact (BLC) structure, and the other terminal of the transistor is electrically connected to the capacitor, such that data is stored or output through the BL. The resistance of the BLC structure is a major factor affecting the timeliness of data transfer. Therefore, it is necessary to measure the resistance of the BLC structure through a test structure.

However, the resistance measurement method in the related art has low accuracy and cannot characterize the real resistance of the BLC structure in the memory cell.

SUMMARY

A first aspect of the embodiments of the present disclosure provides a test structure of a wafer. The test structure of a wafer includes at least one test unit provided in a scribe line of the wafer, where the test unit includes a first active area and a second active area that are connected to each other; the first active area is provided with a first conductive plug, and the second active area is provided with a second conductive plug; one of the first active area and the second active area is provided with a contact structure; and the contact structure is the same as a BLC structure in a die region of the wafer.

A second aspect of the embodiments of the present disclosure provides a method of manufacturing a test structure of a wafer, including the following steps:
  providing a wafer, where the wafer includes multiple die regions and scribe lines located between adjacent die regions;
  forming at least one test unit in the scribe lines, where the test unit includes a first active area and a second active area that are connected to each other;
  forming a contact structure in the first active area and a contact structure in the second active area, where the contact structures are the same as BLC structures in the die regions of the wafer; and
  forming a first conductive plug in the first active area and a second conductive plug in the second active area.

BRIEF DESCRIPTION OF THE DRAWINGS

To describe the technical solutions in the embodiments of the present disclosure or in the prior art more clearly, the following briefly describes the drawings required for describing the embodiments or the prior art. Apparently, the drawings in the following description show some embodiments of the present disclosure, and a person of ordinary skill in the art may still derive other drawings from these drawings without creative efforts.

DETAILED DESCRIPTION

Figure 1:
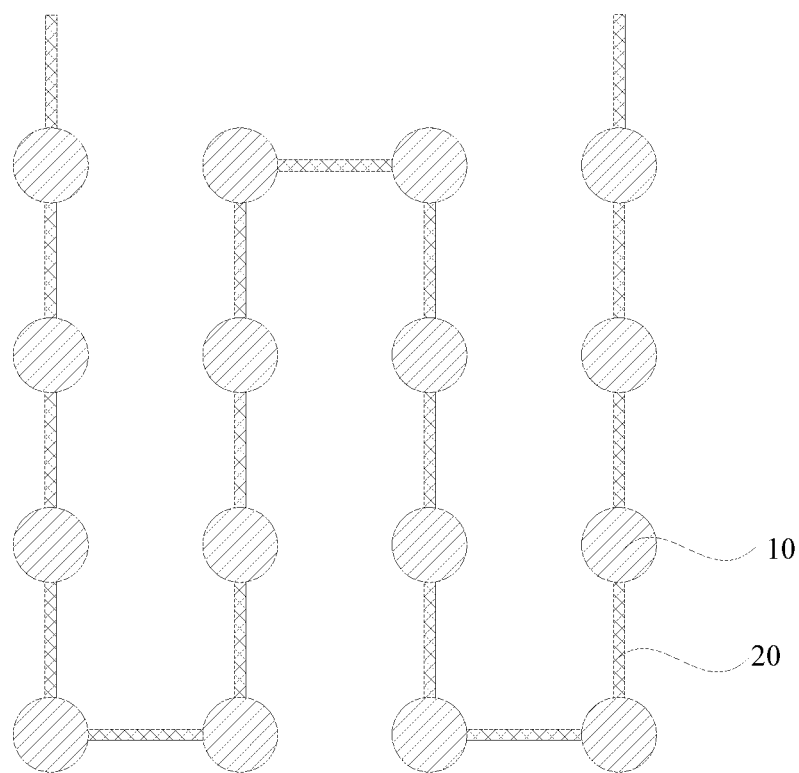
FIG. 1 is a schematic view of a test structure in the related art.

In order to measure the resistance of a bit line contact (BLC) structure in a die region of a wafer, the following method is usually adopted in the related art: provide a substrate; form multiple vias in the substrate by patterning the substrate; deposit a conductive material for preparing BLC structures in the vias by a deposition process to form conductive structures 10, as shown in FIG. 1; form connecting wires 20 for connecting the conductive structures 10 in the substrate, so as to connect the conductive structures 10 in series; calculate a resistance of a single conductive structure 10 by measuring a total resistance of all the conductive structures 10 and dividing by a number of the conductive structures 10; and characterize the resistance of a single BLC structure in the die region of the wafer by the resistance of the single conductive structure. When the BLC structures are prepared, due to the influence of the process, the shape or structure of each of the BLC structures is different from the ideal one. The conductive structures cannot completely simulate the shape and structure of the BLC structures. Therefore, there is a difference between the resistance of the BLC structures and the actual resistance of the BLC structures.

Repeated thinking and demonstration has shown that, if a test unit is formed directly on a scribe line of the wafer and the contact structure of the test unit is prepared together with the BLC structure in the die region of the wafer, the resistance of the BLC structure in the die region of the wafer can be accurately measured.

In view of this, in the embodiments of the present disclosure, a test unit is formed in a scribe line of a wafer, and a contact structure of the test unit is formed together with a BLC structure in a die region of the wafer. Therefore, the resistance of the contact structure in the test unit can be measured as that of the BLC structure in the die region of the wafer. This ensures the accuracy of the resistance of the BLC structure in the die region of the wafer, and provides a numerical reference for the design of a semiconductor structure.

In order to make the objectives, features and advantages of the embodiments of the present disclosure clearer, the technical solutions in the embodiments of the present disclosure are described clearly and completely below with reference to the drawings in the embodiments of the present disclosure. Apparently, the described embodiments are merely part rather than all of the embodiments of the present disclosure. All other embodiments obtained by those of ordinary skill in the art based on the embodiments of the present disclosure without creative efforts should fall within the protection scope of the present disclosure.

Figure 2:
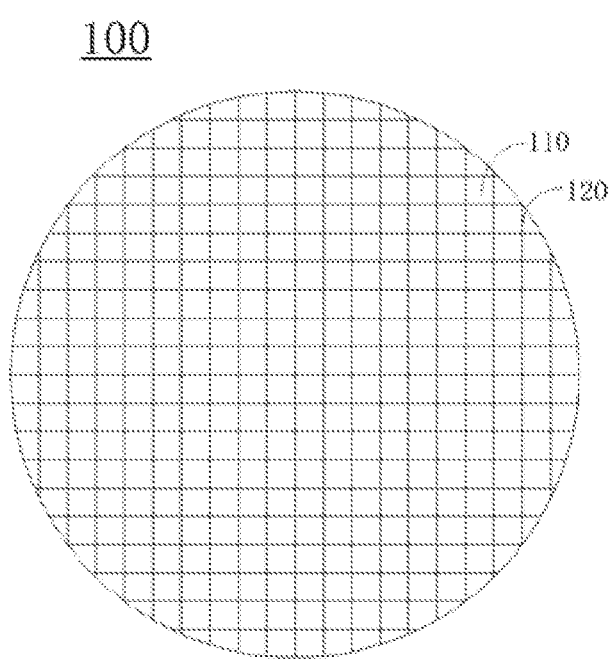
FIG. 2 is a schematic view of a wafer according to an embodiment of the present disclosure.

In die preparation, multiple die regions may be formed on a wafer first, and then the multiple die regions may be divided by a dicing tool to form multiple dies. Referring to FIG. 2, a wafer 100 may include multiple die regions 110 and scribe lines 120 for separating the die regions 110. The multiple die regions 110 may be arranged in an array. Among the multiple scribe lines 120, some scribe lines 120 extend in a row direction, and other scribe lines 120 extend in a column direction.

Figure 3:
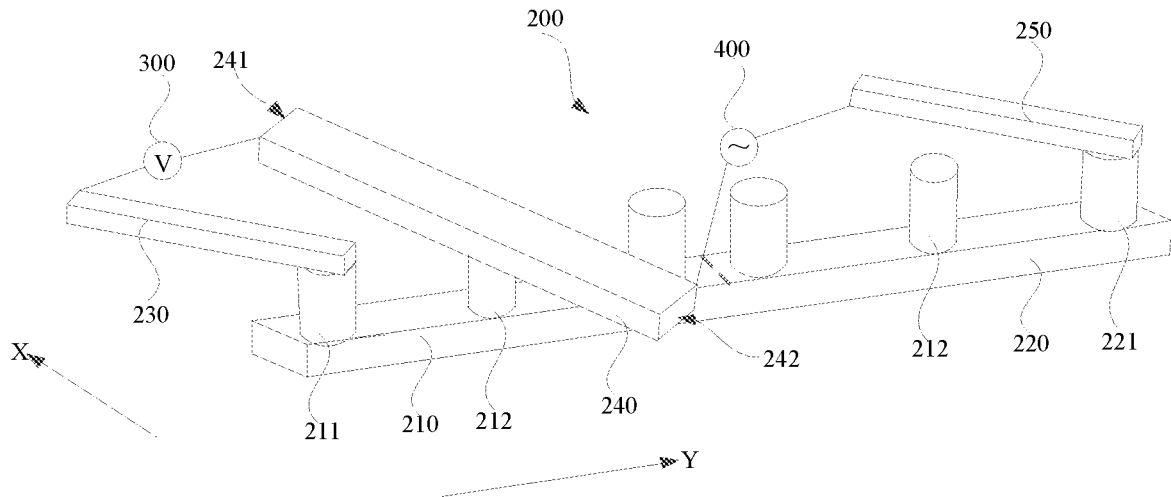
FIG. 3 is a schematic view of a test structure of a wafer according to an embodiment of the present disclosure.

As shown in FIG. 3, an embodiment of the present disclosure provides a test structure of a wafer. The test structure of a wafer includes at least one test unit 200, and the at least one test unit 200 is provided in a scribe line 120 of the wafer.

As shown in FIG. 3, the test unit 200 includes a first active area 210 and a second active area 220 that are connected to each other. The first active area 210 and the second active area 220 extend in the same direction, and both extend in a second direction. The second direction may be a Y direction in FIG. 3.

The first active area 210 is provided with a first conductive plug 211, and the second active area 220 is provided with a second conductive plug 221. The first conductive plug 211 and the second conductive plug 221 may be capacitive contact structures formed together with those in a die region of the wafer.

One of the first active area 210 and the second active area 220 is provided with a contact structure 212. That is to say, the contact structure 212 may be provided in the first active area 210 or in the second active area 220. The contact structure 212 is the same as a BLC structure in the die region of the wafer. That is, the contact structure 212 and the BLC structure in the die region of the wafer are prepared by the same process.

It should be noted that the first active area 210, the second active area 220, the first conductive plug 211, the contact structure 212 and the second conductive plug 221 are all formed on the scribe line 120 of the wafer.

In this embodiment, the contact structure of the test unit and the BLC structure in the die region of the wafer are simultaneously fabricated through the same process. The contact structure of the test unit replicates the BLC structure in the die region of the wafer. Therefore, the resistance of the BLC structure in the die region of the wafer can be accurately measured by the test structure, which provides a numerical reference for the design of a semiconductor structure.

In addition, in this embodiment, the first active area and the second active area are connected together to form an active area with a larger size. This facilitates the subsequent connection of a voltage measuring device and a current input device to the test unit separately, and facilitates the measurement of the resistance of the contact structure. In this embodiment, by measuring the resistance of a single contact structure, the resistance of the BLC structure in the die region of the wafer can be accurately measured. Therefore, the present embodiment avoids errors caused by measuring multiple conductive structures in the related art.

In some embodiments, referring to FIG. 3, one terminal of a voltage measuring device 300 is connected to one of the first conductive plug 211 and the second conductive plug 221, and the other terminal of the voltage measuring device 300 is connected to the contact structure 212.

One terminal of a current input device 400 is connected to the other of the first conductive plug 211 and the second conductive plug 221, and the other terminal of the current input device 400 is connected to the contact structure 212.

For example, if one terminal of the voltage measuring device 300 is connected to the first conductive plug 211. Accordingly, one terminal of the current input device 400 is connected to the second conductive plug 221.

The voltage measuring device 300 may include a voltmeter. The current input device 400 may include a current source. For example, the current source may be an alternating current (AC) power source or a direct current (DC) power source.

In this embodiment, the current input device supplies a constant current to one of the active areas. Since the second active area is connected to the first active area, the constant current will be transferred to the other active area, such that there is a constant current on the contact structure. The voltage measuring device measures the voltage on the contact structure, and the resistance of the contact structure is calculated by a ratio between the voltage and the constant current.

It should be noted that, the voltage measuring device 300 and the first conductive plug 211 may be directly connected or indirectly connected. Alternatively, the voltage measuring device 300 and the contact structure 212 may be directly connected or indirectly connected.

For example, referring to FIG. 3, the test unit 200 further includes a first wire 230, a second wire 240 and a third wire 250. The first wire 230 is electrically connected to the first conductive plug 211. The second wire 240 is electrically connected to the contact structure 212. The third wire 250 is electrically connected to the second conductive plug 221. The contact structure 212 may be connected to a central region of the second wire 240.

In a first direction, that is, an X direction in FIG. 3, the second wire 240 has a first terminal 241 and a second terminal 242 provided opposite to each other. Taking the orientation shown in FIG. 3 as an example, the first terminal 241 is a rear terminal of the second wire 240, and the second terminal 242 is a front terminal of the second wire 240.

When the contact structure 212 is provided in the first active area 210 between the first conductive plug 211 and the second conductive plug 221, one terminal of the voltage measuring device 300 is connected to the first wire 230, and the other terminal of the voltage measuring device 300 is connected to the first terminal 241 of the second wire 240. A connection terminal between the voltage measuring device 300 and the first wire 230 is not the same as that between the first wire 230 and the first conductive plug 211. Exemplarily, the rear terminal of the first wire 230 is connected to the voltage measuring device 300, and the front terminal of the first wire 230 is connected to the first conductive plug 211.

One terminal of the current input device 400 is connected to the third wire 250, and the other terminal of the current input device 400 is connected to the second terminal 242 of the second wire 240. A connection terminal between the current input device 400 and the third wire 250 is not the same as that between the third wire 250 and the second conductive plug 221. Exemplarily, the rear terminal of the third wire 250 is connected to the current input device 400, and the front terminal of the second wire 240 is connected to the second conductive plug 221.

When the contact structure 212 is provided in the second active area 220 and located between the first conductive plug 211 and the second conductive plug 221, one terminal of the voltage measuring device 300 is connected to the third wire 250, and the other terminal of the voltage measuring device 300 is connected to the first terminal 241 of the second wire 240. A connection terminal between the voltage measuring device 300 and the third wire 250 is not the same as that between the third wire 250 and the second conductive plug 221. Exemplarily, the rear terminal of the third wire 250 is connected to the voltage measuring device 300, and the front terminal of the third wire 250 is connected to the second conductive plug 221.

One terminal of the current input device 400 is connected to the first wire 230, and the other terminal of the current input device 400 is connected to the first terminal 241 of the second wire 240. A connection terminal between the current input device 400 and the first wire 230 is not the same as that between the first wire 230 and the first conductive plug 211. Exemplarily, the rear terminal of the first wire 230 is connected to the current input device 400, and the front terminal of the first wire 230 is connected to the first conductive plug 211.

In this embodiment, through the connection of the first wire, the second wire and the third wire, a voltage difference measured by the voltage measuring device is the voltage on the contact structure. This design avoids the interference of the parasitic resistances of the active areas and the conductive plugs, and improves the measurement accuracy.

In some embodiments, the second wire 240 may include bit lines (BLs) extending in the first direction. The first direction defines a preset angle with the extending direction of the first active area 210 and the second active area 220, which may be between 0° and 90°.

The first wire 230 and the third wire 250 may be metal wires. For example, the metal wires may be made of copper, aluminum or tungsten.

In this embodiment, the first wire and the third wire may be prepared together with metal wires in the die region of the wafer. The second wire may be prepared together with the BLs in the die region of the wafer. This simplifies the fabrication process of the test structure, thereby reducing the production cost of the test structure.

Referring to FIG. 3, the first conductive plug 211 may be provided at an end of the first active area 210 away from the second active area 220. For example, the first conductive plug 211 is provided on a left side of the contact structure 212, that is, a left half of the first active area 210.

The second conductive plug 221 is provided at an end of the second active area 220 away from the first active area 210. For example, the second conductive plug 221 is provided on a right side of the contact structure 212, that is, a right half of the second active area 220.

In this embodiment, by designing the positions of the first conductive plug, the second conductive plug and the contact structure, the voltage difference measured by the voltage measuring device is the voltage on the contact structure. This avoids the interference of the parasitic resistances of the active areas and the conductive plugs, and improves the measurement accuracy.

Figure 4:
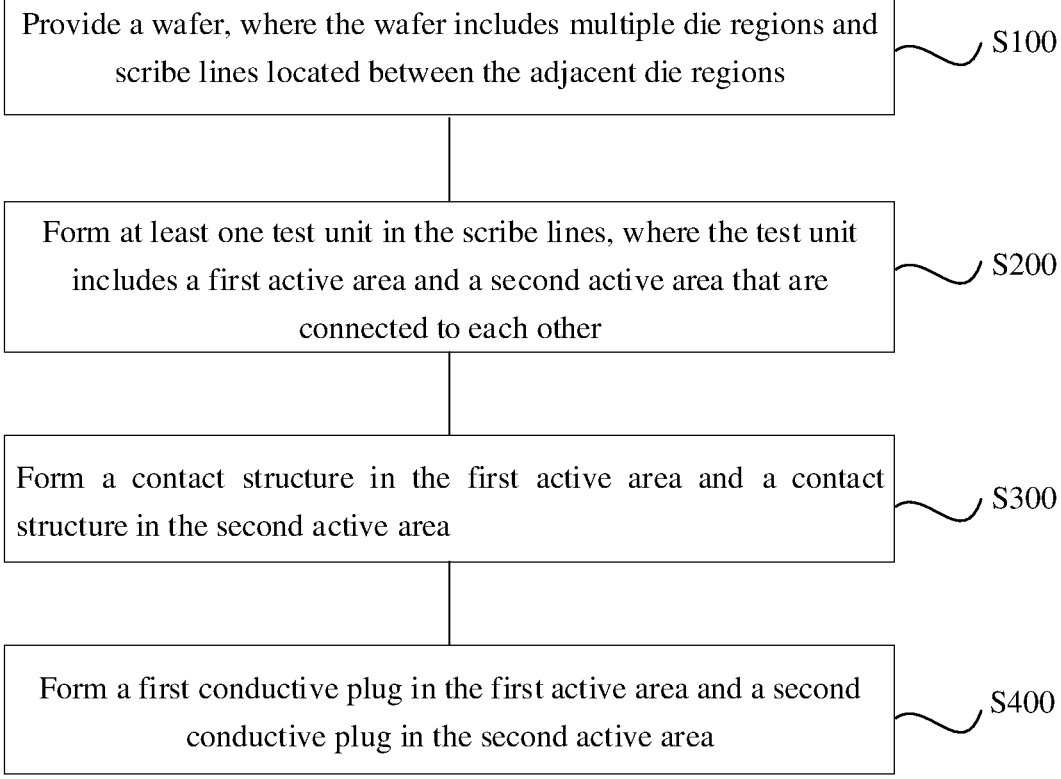
FIG. 4 is a flowchart of a method of manufacturing a test structure of a wafer according to an embodiment of the present disclosure.

As shown in FIG. 4, an embodiment of the present disclosure provides a method of manufacturing a test structure of a wafer, including the following steps:

S100: Provide a wafer, where the wafer includes multiple die regions and scribe lines located between adjacent die regions, as shown in FIG. 2.

S200: Form at least one test unit in the scribe lines, where the test unit includes a first active area and a second active area that are connected to each other.

It should be noted that the die regions 110 and the scribe lines 120 are provided with a base. The first active area 210 and the second active area 220 are formed on the base of the scribe lines.

Figure 5:
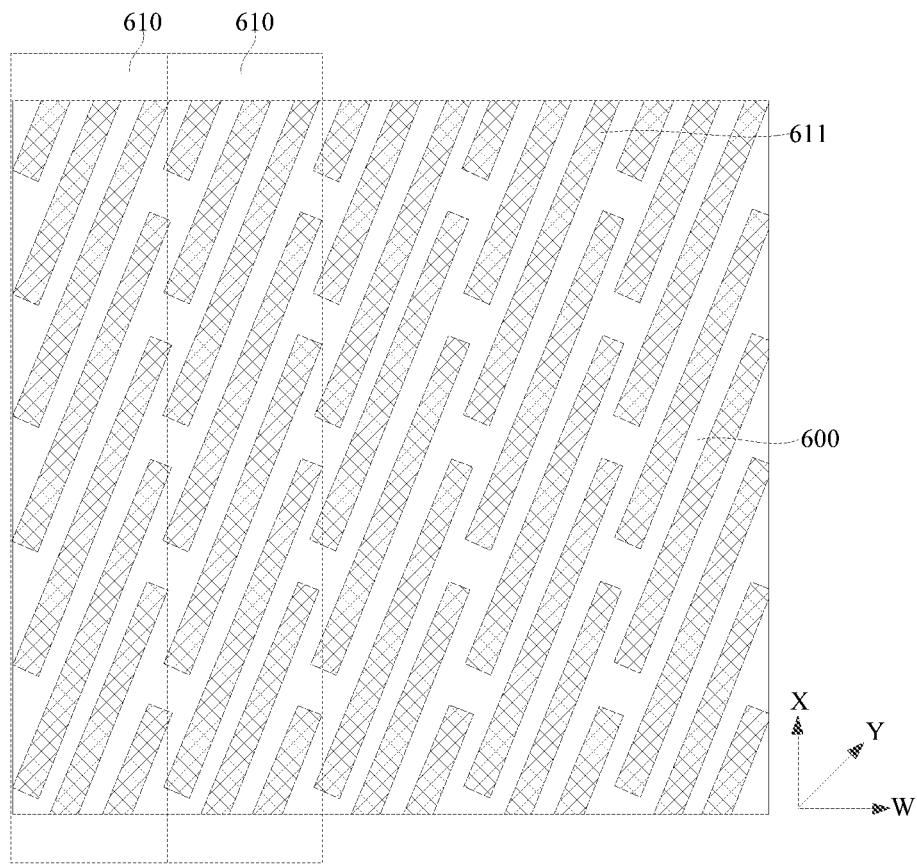
FIG. 5 is a schematic view of forming a first mask layer by the method of manufacturing a test structure of a wafer according to an embodiment of the present disclosure.

In a feasible implementation of the test unit, as shown in FIG. 5, a first mask layer 600 is formed on the base of the scribe lines 120. The first mask layer 600 may include a photoresist layer, or may include multiple sub-mask layers, which is not specifically limited in this embodiment.

After the first mask layer 600 is formed, the first mask layer 600 may be patterned to form a first mask pattern in the first mask layer 600. The first mask pattern includes multiple mask strip groups 610, as shown in FIG. 5. Referring to FIG. 5, one mask strip group 610 is located in a box. The multiple mask strip groups 610 may be sequentially arranged in a third direction, that is, the multiple mask strip groups 610 may be sequentially arranged in a row direction W.

Each of the mask strip groups 610 includes multiple first mask strips 611 arranged at intervals in a first direction. For example, referring to FIG. 5, each of the mask strip groups 610 includes multiple first mask strips 611 that are arranged at intervals, and the multiple first mask strips 611 are arranged at intervals in an X direction in FIG. 5. The multiple first mask strips 611 extend in a second direction, which is a Y direction in FIG. 5. The second direction intersects the first direction, and the third direction and the first direction are perpendicular to each other.

Figure 6:
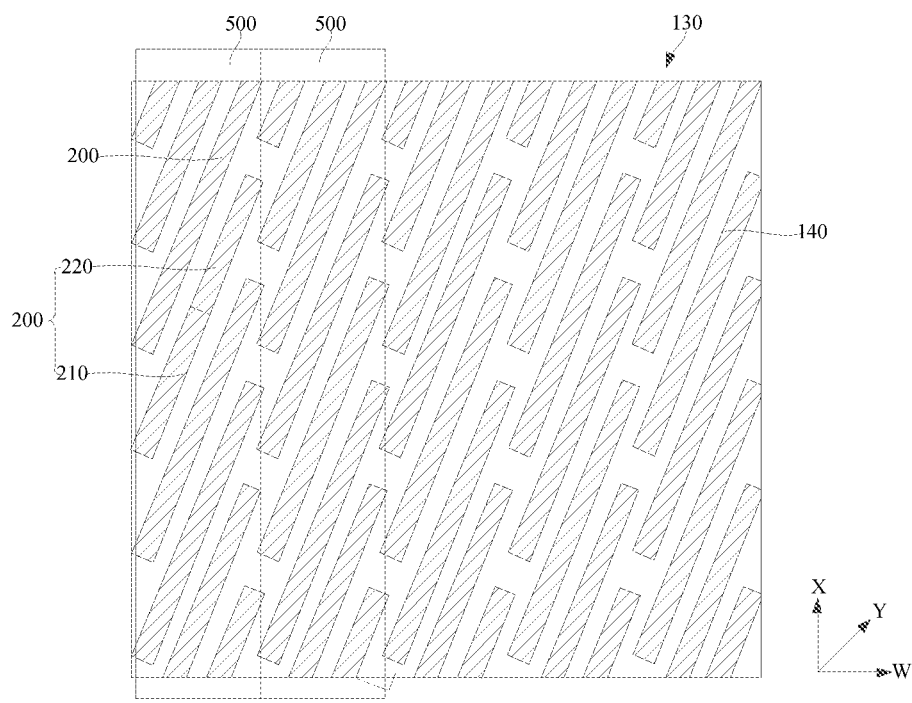
FIG. 6 is a schematic view of forming an active area group by the method of manufacturing a test structure of a wafer according to an embodiment of the present disclosure.

As shown in FIG. 6, the base 130 not covered by the first mask strips 611 is removed by a certain thickness by using an etching liquid or etching gas to form multiple mutually isolated active area groups 500 in the base 130. The multiple active area groups 500 are sequentially arranged in the row direction W. As shown in FIG. 6, one active area group 500 is located in a box.

Each of the active area groups 500 includes multiple active areas arranged at intervals in the first direction. That is, each of the active area groups 500 includes multiple active areas arranged at intervals in the X direction in FIG. 6. Each of the active areas includes a first active area 210 and a second active area 220 that are connected to each other. Each of the active areas defines a test unit 200.

Figure 7:
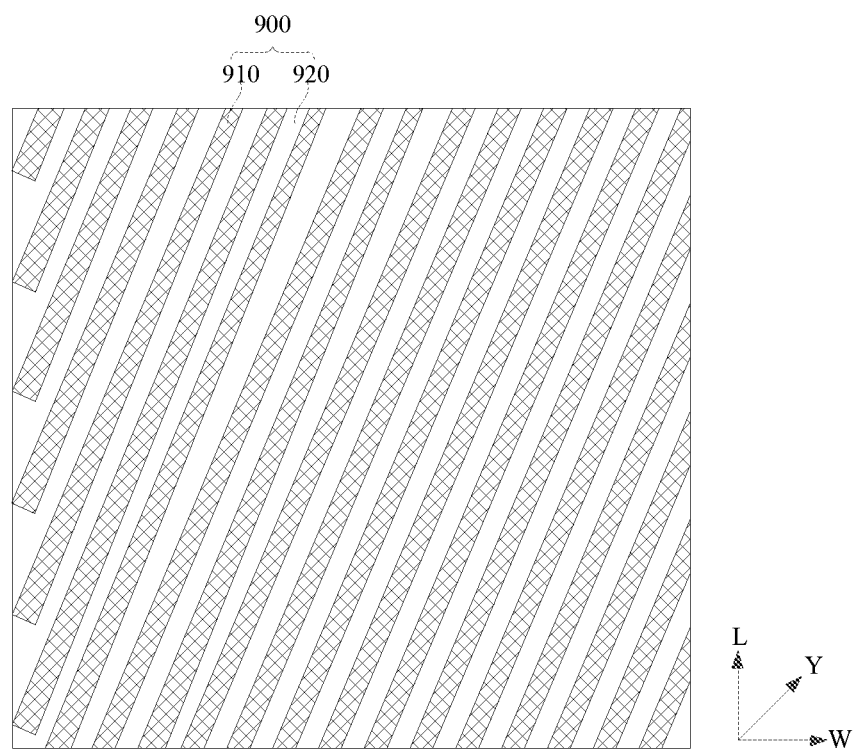
FIG. 7 is a schematic view of forming a second mask layer by the method of manufacturing a test structure of a wafer according to an embodiment of the present disclosure.

In another feasible implementation of the test unit, as shown in FIG. 7, a second mask layer 900 is formed on the scribe lines. The second mask layer 900 may include a photoresist layer, or may include multiple sub-mask layers, which are not specifically limited in this embodiment.

After the second mask layer 900 is formed, the second mask layer 900 is patterned to form a second mask pattern in the second mask layer 900. The second mask pattern includes multiple second mask strips 910 and first openings 920 separating the multiple second mask strips 910. For example, second openings are formed between adjacent second mask strips 910.

The multiple second mask strips 910 extend in the second direction, and the multiple second mask strips 910 are arranged at intervals in a direction perpendicular to the second direction. The second direction intersects the row direction. The second direction is the Y direction in FIG. 7, and the row direction is the W direction in FIG. 7.

Figure 8:
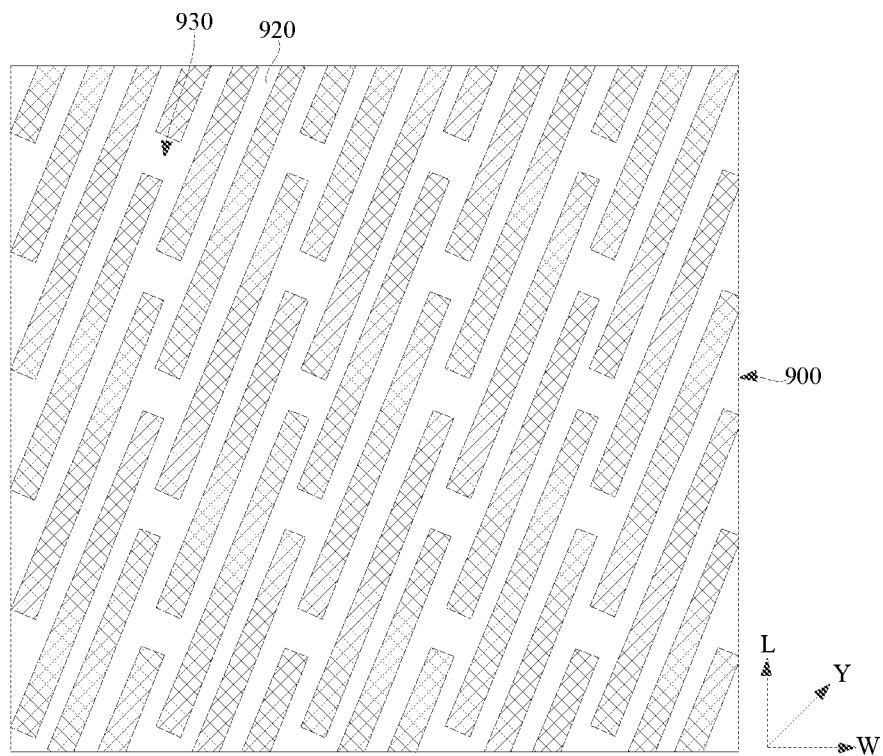
FIG. 8 is a schematic view of forming a second opening by the method of manufacturing a test structure of a wafer according to an embodiment of the present disclosure.

Then, multiple mask portions which are arranged at intervals may be formed on each of the second mask strips, and parts of each of the second mask strips are exposed between adjacent mask portions. The parts of each of the second mask strips 910 are removed by using an etching solution or an etching gas. That is, regions exposed between adjacent mask portions are removed to form multiple second openings 930 in each of the second mask strips 910. The second openings 930 are arranged at intervals in the second direction, as shown in FIG. 8.

The base 130 exposed in the first openings 920 and the second openings 930 is removed by a certain thickness to form multiple active area groups 500 in the base 130. Each of the active area groups includes multiple active areas arranged at intervals in the first direction. Each of the active areas includes a first active area 210 and a second active area 220 that are connected to each other. Each of the active areas defines a test unit 200. The first active area 210 and the second active area 220 extend in the second direction, as shown in FIG. 6.

After the base 130 is removed by a certain thickness, trenches are formed in the base 130. That is, the trenches are formed in regions of the base 130 other than the active area groups. Therefore, after the test unit is formed, an insulating material needs to be deposited in the trenches by a deposition process to form shallow trench isolation (STI) structures 140. The STI structures 140 are used to achieve insulation between adjacent test units 200. The insulating material may include silicon oxide.

S300: Form contact structures in the first active area and the second active area, respectively.

Figure 9:
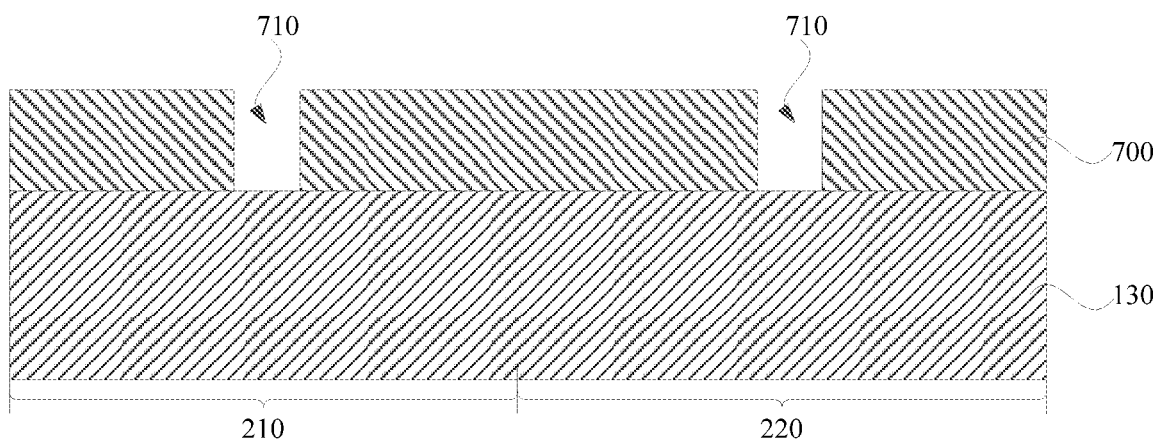
FIG. 9 is a schematic view of forming a first dielectric layer and a first via by the method of manufacturing a test structure of a wafer according to an embodiment of the present disclosure.

Exemplarily, as shown in FIG. 9, a first dielectric layer 700 may be formed on the first active area 210 and the second active area 220 through a deposition process. Then, the first dielectric layer 700 is patterned to form two first vias 710 which are arranged at intervals in the first dielectric layer 700. Projection of one of the first vias 710 on the base 130 is located in the first active area 210, and projection of the other of the first vias 710 on the base 130 is located in the second active area 220.

Figure 10:
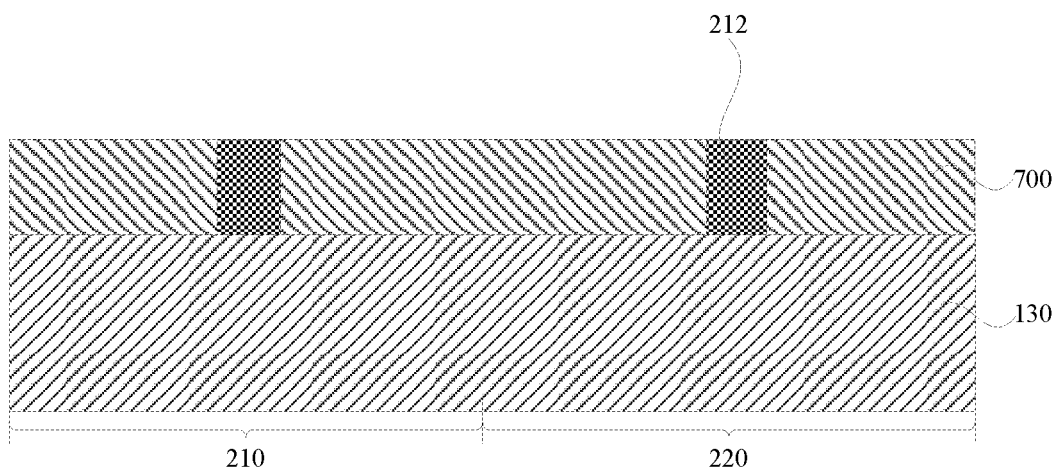
FIG. 10 is a schematic view of forming a contact structure by the method of manufacturing a test structure of a wafer according to an embodiment of the present disclosure.

As shown in FIG. 10, contact structures 212 are formed in the first via 710 through a deposition process. A contact structure 212 located in the first active area is electrically connected to the first active area 210, and a contact structure 212 located in the second active area is electrically connected to the second active area. The contact structures 212 may be BLC structures.

Figure 11:
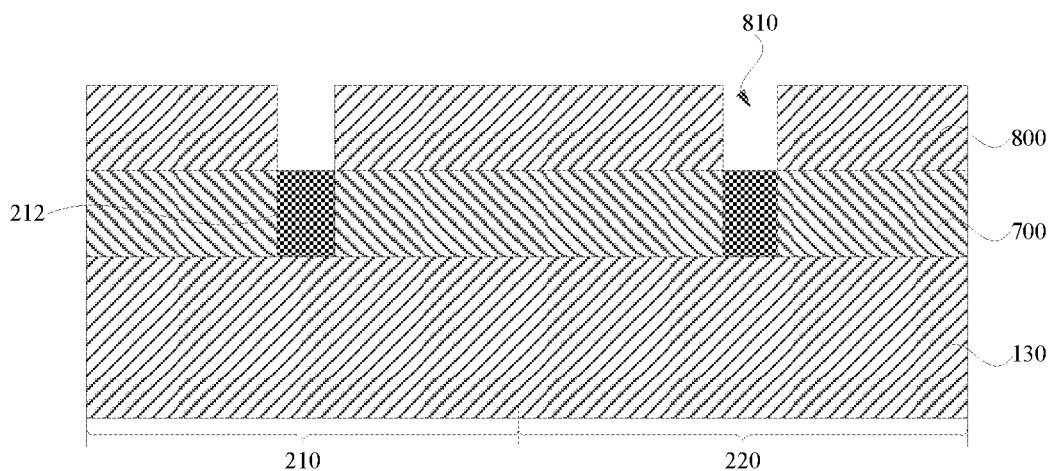
FIG. 11 is a schematic view of forming a second dielectric layer and a second via by the method of manufacturing a test structure of a wafer according to an embodiment of the present disclosure.
Figure 12:
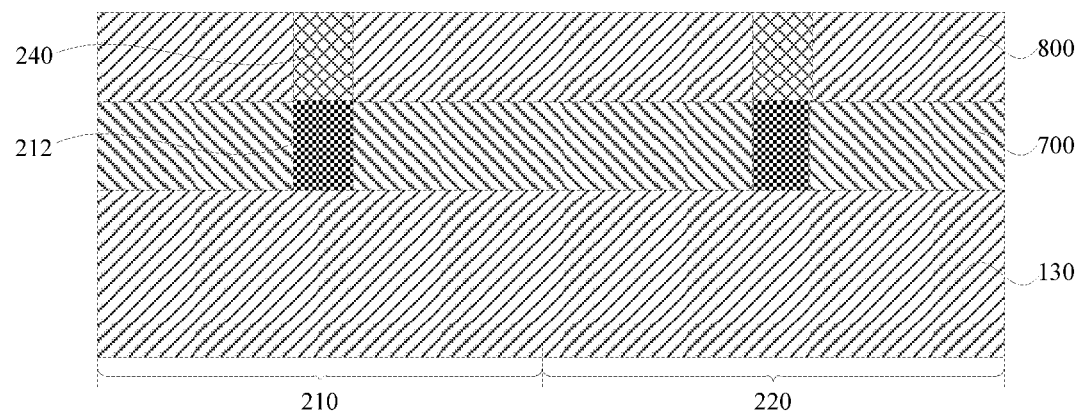
FIG. 12 is a schematic view of forming a second wire by the method of manufacturing a test structure of a wafer according to an embodiment of the present disclosure.

As shown in FIGS. 11 and 12, after the contact structures 212 are formed, a second dielectric layer 800 may be formed on the first dielectric layer 700. The second dielectric layer 800 is patterned to form two second vias 810 which are arranged at intervals in the second dielectric layer 800. The second vias 810 expose the contact structures 212, respectively. Then, a conductive material is deposited in the second vias 810 through a deposition process to form second wires 240. The second wires 240 are connected to the contact structures 212, respectively.

Figure 13:
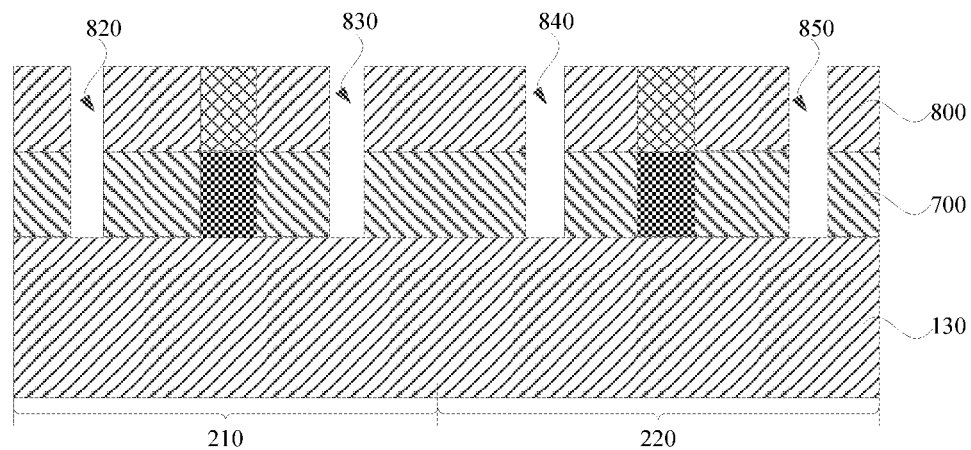
FIG. 13 is a schematic view of forming a third via, a fourth via, a fifth via and a sixth via by the method of manufacturing a test structure of a wafer according to an embodiment of the present disclosure.

As shown in FIG. 13, after the second wires 240 are formed, a third via 820, a fourth via 830, a fifth via 840 and a sixth via 850 are formed in the second dielectric layer 800 at intervals. A bottom of the third via 820 defines a top surface of the first active area 210. The third via 820 is located on a side of the contact structure 212 in the first active area 210 away from the second active area 220. Taking the orientation shown in FIG. 11 as an example, the third via 820 is located on a left side of the contact structure 212 in the first active area 210. A bottom of the fourth via 830 defines a top surface of the first active area 210. The fourth via 830 is located on a right side of the contact structure 212 in the first active area 210. A bottom of the fifth via 840 defines a top surface of the second active area 220. The fifth via 840 is located on a left side of the contact structure 212 in the second active area 220. A bottom of the sixth via 850 defines a top surface of the second active area 220. The sixth via 850 is located in the second active area 220 on a side of the contact structure 212 away from the first active area 210. That is, the sixth via 850 is located on a right side of the contact structure 212 in the second active area 220.

Figure 14:
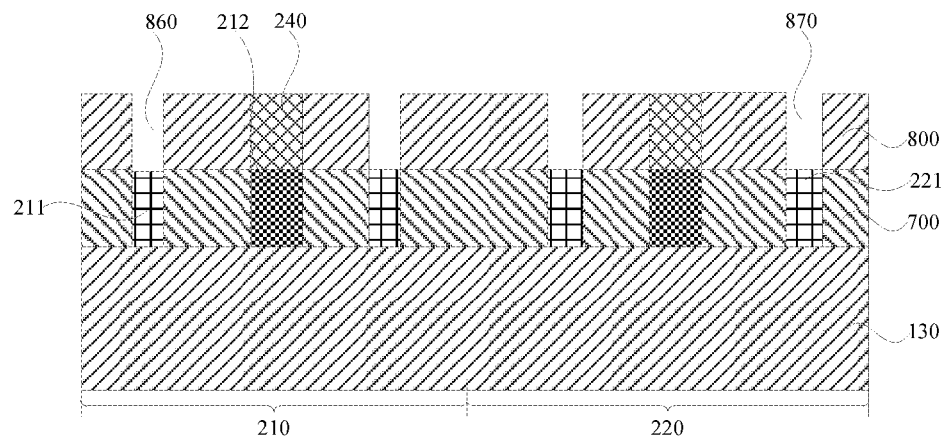
FIG. 14 is a schematic view of forming a first conductive plug and a second conductive plug by the method of manufacturing a test structure of a wafer according to an embodiment of the present disclosure.
Figure 15:
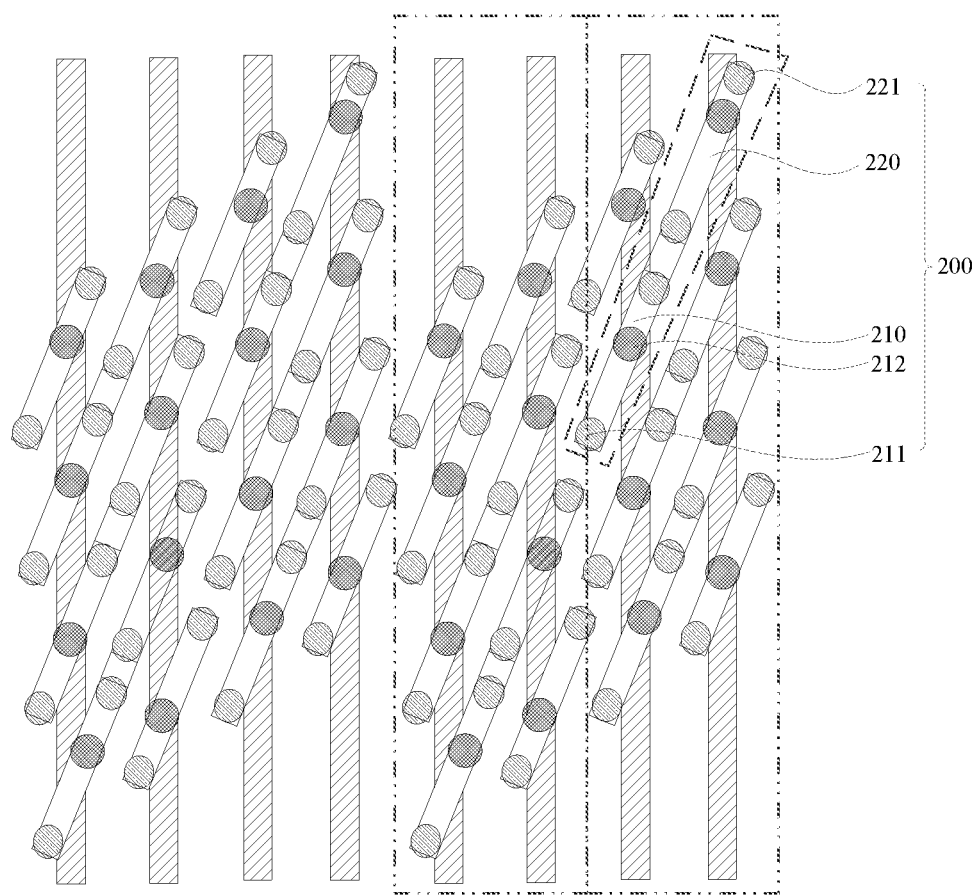
FIG. 15 is a top view of a test unit according to an embodiment of the present disclosure.

As shown in FIG. 14, a conductive material is deposited in the third via 820, the fourth via 830, the fifth via 840 and the sixth via 850 through a deposition process, and the conductive material fills the third via 820, the fourth via 830, the fifth via 840 and the sixth via 850. Then the conductive material is etched back. The conductive material in the third via 820 defines a first conductive plug 211. The conductive material in the sixth via 850 defines a second conductive plug 221. Top surfaces of the first conductive plug 211 and the second conductive plug 221 are flush with that of the first dielectric layer 700, as shown in FIG. 15 (top view). It should be noted that when the conductive material is deposited, the conductive material is also deposited in the fourth via 830 and the fifth via 840 to form conductive pillars. The conductive pillars, the first conductive plug and the second conductive plug each correspond to a capacitive contact structure in the die region.

Figure 16:
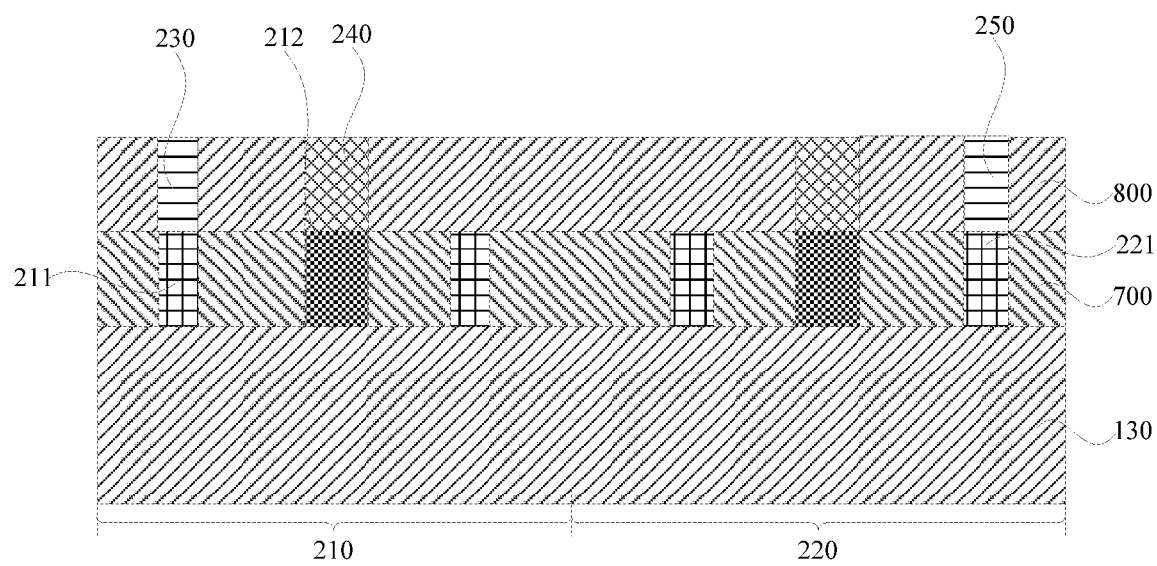
FIG. 16 is a schematic view of forming a first wire and a second wire by the method of manufacturing a test structure of a wafer according to an embodiment of the present disclosure.

As shown in FIG. 16, after the conductive plugs are formed, the top surface of the first conductive plug 211 and the second dielectric layer 800 define a first filling region 860. The top surface of the second conductive plug 221 and the second dielectric layer 800 define a second filling region 870. Through a deposition process, a first wire 230 is formed in the first filling region 860 and a third wire 250 is formed in the second filling region 870.

Finally, an insulating material is deposited in regions defined by the conductive pillars and the second dielectric layer 800, such that the insulating material is integrated with the second dielectric layer 800.

The contact structures 212 can be measured by a voltage measuring device and a current input device. Exemplarily, as shown in FIG. 3, to measure the resistance of the contact structure 212 located in the first active area 210, one terminal of the voltage measuring device 300 is connected to the first conductive plug 211, and the other terminal of the voltage measuring device 300 is connected to the contact structure 212 located in the first active area 210. One terminal of the current input device 400 is connected to the second conductive plug 221, and the other terminal of the current input device 400 is connected to the contact structure 212 in the first active area 210.

In this embodiment, the current input device supplies a constant current to the second active area. Since the second active area is connected to the first active area, the constant current will be transferred to the first active area, such that there is a constant current on the contact structure in the first active area. In this embodiment, the voltage measuring device measures the voltage on the contact structure, and the resistance of the contact structure is calculated by a ratio between the voltage and the constant current.

In addition, to measure the resistance of the contact structure 212 located in the second active area 220, the voltage measuring device 300 may be provided between the second conductive plug 221 and the contact structure 212 located in the second active area 220. For example, one terminal of the voltage measuring device 300 is connected to the third wire 250, and the other terminal of the voltage measuring device 300 is connected to the second wire 240 connected to the contact structure 212 in the second active area 220.

The current input device 400 is provided between the first conductive plug 211 and the contact structure 212 in the second active area 220. For example, one terminal of the current input device 400 is connected to the first wire 230, and the other terminal of the current input device 400 is connected to the second wire 240 connected to the contact structure 212 in the second active area 220.

The current input device supplies a constant current to the first active area. Since the first active area is connected to the second active area, the constant current will be transferred to the second active area, such that there is a constant current on the contact structure in the second active area. In this embodiment, the voltage measuring device measures the voltage on the contact structure, and the resistance of the contact structure is calculated by a ratio between the voltage and the constant current.

In this embodiment, the contact structure of the test unit and the BLC structure in the die region of the wafer are simultaneously fabricated through the same process. The contact structure of the test unit replicates the BLC structure in the die region of the wafer. Therefore, the resistance of the BLC structure in the die region of the wafer can be accurately measured by the test structure, which provides theoretical support for the design of a semiconductor structure.

The embodiments or implementations of this specification are described in a progressive manner, and each embodiment focuses on differences from other embodiments. The same or similar parts between the embodiments may refer to each other.

In the descriptions of this specification, a description with reference to the term "one implementation", "some implementations", "an exemplary implementation", "an example", "a specific example", "some examples", or the like means that a specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

Finally, it should be noted that the foregoing embodiments are used only to explain the technical solutions of the present disclosure, but are not intended to limit the present disclosure. Although the present disclosure has been described in detail with reference to the foregoing embodiments, those of ordinary skill in the art should understand that they can still modify the technical solutions described in the foregoing embodiments, or make equivalent substitutions on some or all technical features therein. The modifications or substitutions do not make the essence of the corresponding technical solutions deviate from the spirit and scope of the technical solutions of the embodiments of the present disclosure.

The invention claimed is:

1. A method of manufacturing a test structure of a wafer, comprising:

providing a wafer, wherein the wafer comprises multiple die regions and scribe lines located between the adjacent die regions;

forming at least one test unit in the scribe lines, wherein the test unit comprises a first active area and a second active area that are connected to each other;

forming a contact structure in the first active area and a contact structure in the second active area, wherein the contact structures are the same as bit line contact structures in the die regions of the wafer; and forming a first conductive plug in the first active area and a second conductive plug in the second active area;

wherein the forming at least one test unit in the scribe lines comprises:

forming a first mask layer on the scribe lines;

patterning the first mask layer to form a first mask pattern in the first mask layer, wherein the first mask pattern comprises multiple mask strip groups; the multiple mask strip groups are sequentially arranged in a third direction; the mask strip groups each comprises multiple first mask strips arranged at intervals in a first direction; the multiple first mask strips extend in a second direction; the third direction and the first direction are perpendicular to each other; and the second direction intersects the first direction; and removing a base not covered by the first mask strips by a certain thickness, to form multiple active area groups in the base; wherein the multiple active area groups each comprises multiple active areas being arranged at intervals in the first direction, and the multiple active areas each comprises a first active area and a second active area that are connected to each other, and regions of the base other than the active area groups are defined as trenches.

2. The method of manufacturing a test structure of a wafer according to claim 1, wherein after removing the base by a certain thickness to form multiple active area groups in the base, the method of manufacturing a test structure of a wafer further comprises:

depositing an insulating material in the trenches to form a shallow trench isolation structure.

3. The method of manufacturing a test structure of a wafer according to claim 2, wherein after forming a contact structure in the first active area of the test unit and a contact structure in the second active area of the test unit, the method of manufacturing a test structure of a wafer further comprises:

forming a second wire connected to the contact structure in the first active area.

4. The method of manufacturing a test structure of a wafer according to claim 2, wherein after forming a contact structure in the first active area of the test unit and a contact structure in the second active area of the test unit, the method of manufacturing a test structure of a wafer further comprises:

forming a second wire connected to the contact structure in the second active area.

5. The method of manufacturing a test structure of a wafer according to claim 2, wherein after forming a first conductive plug in the first active area of the test unit, the method of manufacturing a test structure of a wafer further comprises:

forming a first wire and a third wire, wherein the first wire is connected to the first conductive plug, and the third wire is connected to the second conductive plug.

6. A test structure of a wafer formed by the method of manufacturing according to claim 1.

7. The test structure of a wafer according to claim 6, wherein the test structure of a wafer further comprises a voltage measuring device and a current input device;

one terminal of the voltage measuring device is connected to one of the first conductive plug and the second conductive plug, and the other terminal of the voltage measuring device is connected to the contact structure; and one terminal of the current input device is connected to the other of the first conductive plug and the second conductive plug, and the other terminal of the current input device is connected to the contact structure.

8. The test structure of a wafer according to claim 7, wherein the test unit further comprises a first wire, a second wire and a third wire; the first wire is electrically connected to the first conductive plug; the third wire is electrically connected to the second conductive plug; the second wire is electrically connected to the contact structure, and comprises a first terminal and a second terminal that are provided opposite to each other in a first direction.

9. The test structure of a wafer according to claim 8, wherein the contact structure is provided in the first active area and located between the first conductive plug and the second conductive plug;

the one terminal of the voltage measuring device is connected to the first wire, and the other terminal of the voltage measuring device is connected to the first terminal of the second wire; and the one terminal of the current input device is connected to the third wire, and the other terminal of the current input device is connected to the second terminal of the second wire.

10. The test structure of a wafer according to claim 8, wherein the contact structure is provided in the second active area and located between the first conductive plug and the second conductive plug;

the one terminal of the voltage measuring device is connected to the third wire, and the other terminal of the voltage measuring device is connected to the first terminal of the second wire; and the one terminal of the current input device is connected to the first wire, and the other terminal of the current input device is connected to the second terminal of the second wire.

11. The test structure of a wafer according to claim 6, wherein the first conductive plug and the second conductive plug each comprises a capacitive contact structure.

12. The test structure of a wafer according to claim 8, wherein the second wire comprises a bit line extending in the first direction, and the first direction defines a preset angle with an extending direction of the first active area and the second active area.

13. The test structure of a wafer according to claim 12, wherein the first wire and the third wire each comprises a metal wire.

14. The test structure of a wafer according to claim 6, wherein the first conductive plug is provided at an end of the first active area away from the second active area; and the second conductive plug is provided at an end of the second active area away from the first active area.

15. A method of manufacturing a test structure of a wafer, comprising:

providing a wafer, wherein the wafer comprises multiple die regions and scribe lines located between the adjacent die regions;

forming at least one test unit in the scribe lines, wherein the test unit comprises a first active area and a second active area that are connected to each other;

forming a contact structure in the first active area and a contact structure in the second active area, wherein the contact structures are the same as bit line contact structures in the die regions of the wafer; and forming a first conductive plug in the first active area and a second conductive plug in the second active area;

wherein the forming at least one test unit in the scribe lines comprises:

forming a second mask layer on the scribe lines;

patterning the second mask layer to form a second mask pattern in the second mask layer, wherein the second mask pattern comprises multiple second mask strips and first openings separating the multiple second mask strips; and the multiple second mask strips extend in a second direction and are arranged at intervals in a direction perpendicular to the second direction;

removing parts of each of the second mask strips to form multiple second openings in each of the second mask strips, wherein the second openings are arranged at intervals in the second direction; and removing a base exposed in the first openings and the second openings by a certain thickness, to form multiple active area groups in the base; wherein the multiple active area groups each comprises multiple active areas arranged at intervals in a first direction, and the multiple active areas each comprises a first active area and a second active area that are connected to each other; and regions of the base other than the active area groups are defined as trenches.

* * * * *